(12) United States Patent
Apfel et al.

(10) Patent No.: US 6,356,624 B1
(45) Date of Patent: Mar. 12, 2002

(54) METHOD AND APPARATUS FOR DETECTING AND MEASURING FOREIGN VOLTAGES

(75) Inventors: Russell J. Apfel; Richard B. Webb; Walter S. Schopfer, all of Austin, TX (US)

(73) Assignee: Leserity, Inc., Austin, TX (US)

( * ) Notice: Subject to any disclaimer, the term of this patent is extended or adjusted under 35 U.S.C. 154(b) by 0 days.

(21) Appl. No.: 09/128,579

(22) Filed: Aug. 4, 1998

(51) Int. Cl.[7] .................................................. H04M 3/22
(52) U.S. Cl. .............................. 379/27.01; 379/27.05; 379/27.08; 379/399.01
(58) Field of Search ................................ 379/6, 29, 30, 379/26, 27, 24, 1.01, 22.03, 22.07, 26.01, 26.02, 27.01, 27.04, 29.03, 29.04, 413.01, 412, 399.01

(56) References Cited

U.S. PATENT DOCUMENTS

| | | | | |
|---|---|---|---|---|
| 4,991,105 A | * | 2/1991 | Pimental | 379/26 |
| 5,260,664 A | * | 11/1993 | Graham | 379/26 |
| 5,390,231 A | * | 2/1995 | Hung et al. | 379/2 |
| 5,428,682 A | * | 6/1995 | Apfel | 379/413 |
| 5,619,567 A | * | 4/1997 | Apfel | 379/413 |
| 5,659,610 A | * | 8/1997 | Schorr et al. | 379/30 |
| 5,694,465 A | * | 12/1997 | Apfel | 379/377 |
| 5,737,411 A | * | 4/1998 | Apfel et al. | 379/413 |
| 5,809,109 A | * | 9/1998 | Moyal et al. | 379/22 |
| 5,937,033 A | * | 8/1999 | Bellows | 379/27 |

* cited by examiner

*Primary Examiner*—Curtis Kuntz
*Assistant Examiner*—Rexford Barnie
(74) *Attorney, Agent, or Firm*—Williams, Morgan & Amerson, P.C.

(57) ABSTRACT

A sensor capable of being coupled to a transmission line and monitoring a foreign voltage on the transmission line includes a voltage monitoring circuit. The voltage monitoring circuit is adapted to operate in a foreign voltage detection mode in response to receiving a first logic signal and a foreign voltage measurement mode in response to receiving a second logic signal. A method for operating a circuit to detect and measure a foreign voltage on a transmission line includes providing a first logic signal to configure the circuit to detect the foreign voltage. The foreign voltage is detected on the transmission line in the circuit. A second logic signal is provided to configure the circuit to measure the foreign voltage, and the foreign voltage is measured.

25 Claims, 2 Drawing Sheets

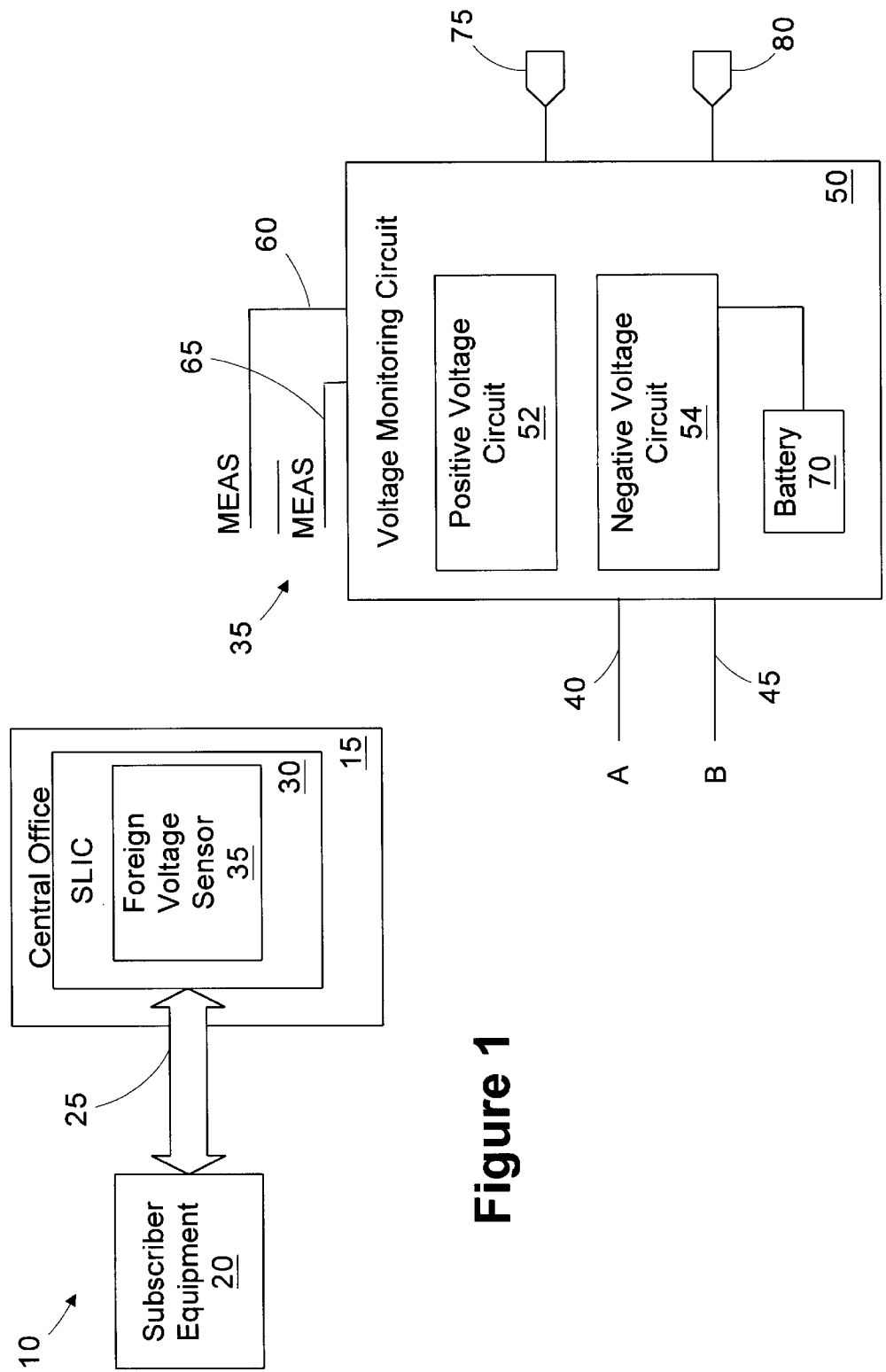

METHOD AND APPARATUS FOR DETECTING AND MEASURING FOREIGN VOLTAGES

BACKGROUND OF THE INVENTION

1. Field of the Invention

This invention relates generally to the monitoring of transmission lines, and more particularly, to the detection and measuring of foreign voltages on communication lines such as telephone subscriber lines.

2. Description of the Related Art

Communication lines, such as subscriber lines in a telephone network, are susceptible to being affected by foreign voltages. Foreign voltages are faults on the subscriber line that are more positive than ground, or more negative than the battery voltage of the telephone network. These faults can adversely affect the operation of the telephone network or can cause damage to connected equipment.

Subscriber lines are tested to detect, among other things, foreign voltages. These tests may be performed as a part of normal maintenance or in response to a customer complaint or service outage. Typically, these measurements are conducted manually or through the use of test equipment external to the subscriber line circuitry. The use of external test equipment is costly, based on the expense of the test equipment and also the time required to connect the equipment to a particular subscriber line being tested.

The present invention is directed to overcoming, or at least reducing the effects of, one or more of the problems set forth above.

SUMMARY OF THE INVENTION

In one aspect of the present invention, a sensor capable of being coupled to a transmission line and monitoring a foreign voltage on the transmission line is provided. The sensor includes a voltage monitoring circuit. The voltage monitoring circuit is adapted to operate in a foreign voltage detection mode in response to receiving a first logic signal and a foreign voltage measurement mode in response to receiving a second logic signal.

In another aspect of the present invention, a method for operating a circuit to detect and measure a foreign voltage on a transmission line is provided. The method includes providing a first logic signal to configure the circuit to detect a foreign voltage. The foreign voltage is detected on the transmission line in the circuit. A second logic signal is provided to configure the circuit to measure the foreign voltage, and the foreign voltage is measured.

BRIEF DESCRIPTION OF THE DRAWINGS

Other objects and advantages of the invention will become apparent upon reading the following detailed description and upon reference to the drawings in which:

FIG. 1 is a block diagram of a communications network of the present invention;

FIG. 2 is a block diagram of a voltage monitoring circuit of the present invention.

Figure 3:
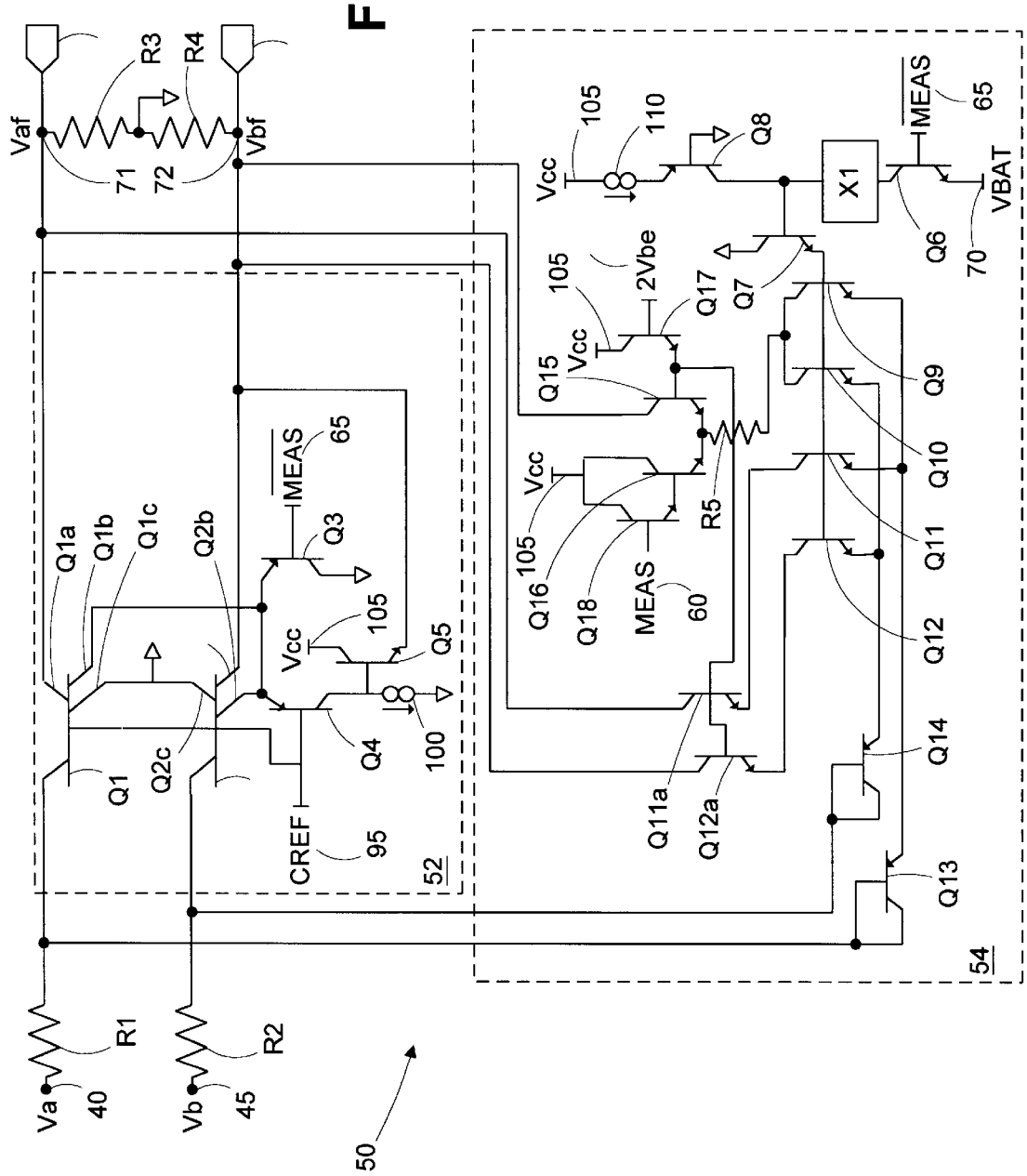
FIG. 3 is a circuit diagram of the voltage monitoring circuit of FIG. 2.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Referring to FIG. 1, a block diagram of a communication network 10 of the present invention is provided. The communication network 10 includes a central office 15 coupled to a subscriber device 20 (e.g., telephone, fax machine, answering machine, modem, or the like) by a subscriber line 25. A subscriber line interface circuit (SLIC) 30 provides an interface between the central office 15 and the subscriber line 25. The communication network 10 may comprise a public switched telephone network (PSTN), a private branch exchange (PBX) network, or some other communications network servicing one or more subscriber lines 25.

A foreign voltage present on the subscriber line 25 may damage the subscriber equipment 20 or equipment at the central office 15, or it may reduce the quality of service provided over the subscriber line 25.

Referring to FIGS. 1 and 2, the SLIC 30 includes a foreign voltage sensor 35 adapted to detect and measure a foreign voltage present on the subscriber line 25. In the illustrated embodiment, the subscriber line 25 includes two conductors, an "A" line 40, and a "B" line 45. The foreign voltage sensor 35 includes a voltage monitoring circuit 50. The voltage monitoring circuit 50 includes a positive voltage circuit 52 and a negative voltage circuit 54 for detecting and measuring foreign voltages on either the A line 40 or the B line 45. The voltage monitoring circuit 50 receives MEAS and MEAS bar logic signals over a pair of lines 60, 65 that change the mode of the voltage monitoring circuit 50 between a detection mode and a measuring mode. The logic signals on the lines 60, 65 are provided by a higher level processor (not shown) responsible for monitoring and controlling the subscriber line 25. A battery voltage source 70 (VBAT) is coupled to the negative voltage circuit 54 to provide a negative reference voltage for detecting a negative foreign voltage. In a typical telephone circuit, VBAT is between about −25 volts and −70 volts, however, other voltages are contemplated, depending on the particular implementation. The voltage monitoring circuit 50 is adapted to detect a positive foreign voltage above ground, and a negative foreign voltage more negative than the battery voltage source 70, VBAT.

The voltage monitoring circuit 50 has output terminals 71, 72 that are coupled to analog to digital (A/D) converters 75, 80. The A/D converters 75, 80 may be located in a coder/decoder (CODEC) (not shown) or digital signal processor (DSP) (not shown) to process the information provided and/or change the mode of the voltage monitoring circuit 50.

For simplicity and clarity, the internal connections between the input lines 40, 45, 60, 65 and output terminals 71, 72 of the voltage monitoring circuit 50, the positive voltage circuit 52, and the negative voltage circuit 54 are not shown in FIG. 2. These connections are described in greater detail in reference to FIG. 3. Referring to FIG. 3, a circuit diagram of the voltage monitoring circuit 50 is provided. The positive voltage circuit 52 includes a p-type split collector transistor Q1 coupled to the A line 40 (Va), and a p-type split collector transistor Q2 coupled to the B line 45 (Vb) through resistors R1 and R2 respectively. The split collector transistors Q1, Q2 each have multiple collector output terminals that are weighted to split the current exiting the collector corresponding to the weighting factor associated with each collector output. The weighting factor is determined by the relative physical sizes of the split collectors. In the illustrated embodiment, the split collector transistors Q1, Q2 are formed sufficiently large to provide accuracy in the weighting factors. In the illustrated embodiment each split collector transistor Q1, Q2 has three collector output terminals with weighting factors of 1/7, 1/7, and 5/7. It is contemplated that rather than using a single transistor Q1 with split collectors, transistors of varying size could be coupled in parallel to a single collector to provide the weighted collector current distribution.

One of the 1/7 collectors Q1a of the split collector transistor Q1 is coupled to the A line output terminal 71 (Vaf), and one of the 1/7 collectors Q2a of the split collector transistor Q2 is coupled to the B line output terminal 72 (Vbf). Resistors R3 and R4 are coupled between the A line output terminal 71 and the B line output terminal 72 and ground, respectively. The A line output terminal 71 is coupled to the A/D converter 75 and the B line output terminal 72 is coupled to the A/D converter 80. The other 1/7 collectors Q1b, Q2b of the split collector transistors Q1, Q2 are coupled to the emitters of p-type transistors Q3 and Q4. The 5/7 collectors Q1c, Q2c of the split collector transistors Q1, Q2 are coupled to ground.

The bases of the split collector transistors Q1, Q2 and the transistor Q4 are coupled to a reference voltage 95 (CREF). The base of the transistor Q3 is coupled to the MEAS bar logic signal line 65. The collector of the transistor Q4 is coupled to a current source 100 and to the base of a n-type transistor Q5. The collector of the transistor Q5 is coupled to a chip voltage source 105 (Vcc), and the emitter is coupled to the 1/7 collector Q2a. In the illustrated embodiment, Vcc is about 5V and CREF is about 3.3V, however, other voltages are contemplated, depending on the specific implementation.

The collectors Q1a, Q1b provide a voltage at the A line and B line output terminals 71, 72 proportional to the voltage on the A and B lines 40, 45, and thus form a proportional portion of the positive voltage circuit 52 to measure the input voltages. The transistors Q3, Q4, Q5 force a positive voltage on the B line output terminal 72 to overdrive the A/D converter 80, and thus form a triggering circuit within the positive voltage circuit 52 to signal the detection of a positive foreign voltage. The operation of the positive voltage circuit 52 in the detect and measure modes will be described in greater detail below.

The negative voltage circuit 54 includes an n-type transistor Q6 coupled to the battery voltage source 70 at its emitter. The base of the transistor Q6 is coupled to the MEAS bar logic signal line 65, and the collector is coupled to a voltage drop element X1. In the illustrated embodiment, the voltage drop element X1 includes three series transistors to provide three diode drops (Vbe). In the illustrated embodiment, diode voltage drops, Vbe, are about 0.7V, however, other voltages are contemplated, depending on the specific devices used. The voltage drop element X1 is coupled to the base of an n-type transistor Q7 and the collector of a p-type transistor Q8. The base of the transistor Q8 is grounded and the emitter is coupled to a current source 110. The collector of the transistor Q7 is grounded and the emitter is coupled to the bases of n-type transistors Q9, Q10, Q11, and Q12.

The emitters of the transistors Q9, Q11 are coupled to the emitter of a p-type transistor Q13, and the emitters of the transistors Q10, Q12 are coupled to the emitter of a p-type transistor Q14. The collectors of the transistors Q13, Q14 are coupled to their respective bases such that they function as diodes. The collectors of the transistors Q13, Q14 are coupled to the resistors R1 and R2, respectively. The collectors of the transistors Q11, Q12 are coupled to the emitters of n-type transistors Q11a, Q12a, respectively. The bases of the transistors Q11a, Q12a are coupled to the emitter of an n-type transistor Q17. The collectors of the transistors Q11a, Q12a are coupled to the 1/7 collectors Q1a and Q2a, respectively. The transistors Q11a, Q12a reduce the voltage across the transistors Q11, Q12 to increase the safe operating voltage limit on the battery voltage source 70 (VBAT). The transistors Q17, Q11a, and Q12a are also used to prevent the voltages on the A line output terminal 71 (Vaf) and B line output terminal 72 (Vbf) from being pulled below ground.

The collectors of the transistors Q9, Q10 are coupled to a resistor R5. The resistor R5 is also coupled to the emitters of n-type transistors Q15, Q16. The collector of the transistor Q15 is coupled to the 1/7 collector Q2a, and the base of the transistor Q15 is coupled to the emitter of the n-type transistor Q17. The collector of the transistor Q17 is coupled to the chip voltage source 105 (Vcc). The base of the transistor Q17 is coupled to a bias voltage source 115. The bias voltage source 115 provides a voltage substantially equal to two diode voltage drops (2Vbe).

The base of the transistor Q16 is coupled to the emitter of an n-type transistor Q18. The base of the transistor Q18 is coupled to the MEAS logic signal line 60. The collectors of the transistors Q16, Q18 are coupled to the chip voltage source 105 (Vcc).

The transistors Q11, Q12 provide a voltage at the A line and B line output terminals 71, 72 proportional to a negative voltage on the A and B lines 40, 45, and thus form a proportional portion of the negative voltage circuit 54 to measure the input voltages. The transistors Q9, Q10 force a negative voltage on the B line output terminal 72 to overdrive the A/D converter 80, and thus form a triggering circuit within the negative voltage circuit 54 to signal the detection of a negative foreign voltage.

The operation of the voltage monitoring circuit 50 in each of the detect and measure modes is now described in detail. As stated above, the mode of the voltage monitoring circuit 50 is controlled by the MEAS and MEAS bar logic signal lines 60, 65. When the MEAS logic signal is low (MEAS bar is high), the voltage monitoring circuit 50 is in the detection mode. Conversely, when the MEAS logic signal is high (MEAS bar is low), the voltage monitoring circuit 50 is in the measure mode. The MEAS and MEAS bar logic signal lines 60, 65 are high at about 5V and low at about 0V, however, other voltages are contemplated, depending on the specific implementation.

During normal, not-fault line conditions, the MEAS logic signal is low and the MEAS bar logic signal is high. In the detection mode, the voltage monitoring circuit 50 has increased sensitivity such that it may quickly detect any foreign voltages that appear on the A or B lines 40, 45. When a positive voltage appears on one or both of the lines 40, 45 of the subscriber line 25, the voltage monitoring circuit 50 drives the B line output terminal 72 to a voltage that overloads the A/D converter 80 in the positive direction. In a similar manner, a negative foreign voltage overdrives the A/D converter 80 in the negative direction.

In the detection mode, the base of the transistor Q6 is activated by the MEAS bar logic signal on the line 65, thus coupling the voltage drop element X1 to the battery voltage source 70 and driving the base input of the transistor Q7. The emitter of the transistor Q7 supplies a voltage substantially equal to VBAT+2Vbe to the bases of the transistors Q9, Q10, Q11, and Q12. The transistor Q3 is held off by the MEAS bar logic signal on the line 65, and a current feed from the $\frac{1}{7}$ collectors Q1$b$ and Q2$b$ to the base of the transistor Q5 through the transistor Q4 is enabled. As long as any foreign voltages present do not cause the voltages Va or Vb to move above CREF or below VBAT, the transistors Q1, Q2, and Q9 through Q12 remain off, and a foreign voltage detection signal is not transferred to the B line output terminal 72.

If either voltage on the A line 40 or B line 45 (Va or Vb) becomes more negative than the battery voltage source 70 (VBAT), the corresponding transistor Q13 for Va and Q14 for Vb turns on and pulls current from the emitters of either or both of the transistor pairs Q9/Q11 for Va and Q10/Q12 for Vb. Because the emitter junctions of the transistor pairs Q9/Q11 and Q10/Q12 are coupled in parallel, the total current flowing through the transistor Q13 or Q14 is split between the corresponding transistor pair Q9/Q11, Q10/Q12 In the illustrated embodiment, the sizing of the transistor pairs Q9/Q11 and Q10/Q12 is selected such that $\frac{1}{7}$ of the current flowing through the associated transistor Q13 or Q14 flows through the transistor Q11, Q12 and $\frac{6}{7}$ flows through the other transistor Q9, Q10 in the pair.

Because the MEAS logic signal on the line 60 is low, the transistor Q15 is enabled. The transistors Q9 and Q10 generate large collector currents that force the voltage at the B line output terminal 72 (Vbf) to a negative voltage sufficient to cause the A/D converter 80 to overflow. The large collector currents flowing through the transistors Q9, Q10 represent a triggering signal. The CODEC (not shown) or DSP (not shown) can sense the overflow condition in the A/D converter 80 and set a negative voltage warning flag or take some other action (e.g., change to measure mode).

If either voltage on the A line 40 or B line 45 (Va or Vb) becomes more positive than CREF, the transistor Q1 for Va or Q2 for Vb begins conducting. Current flows out of the three collectors Q1$a$, Q1$b$, Q1$c$ or Q2$a$, Q2$b$, Q2$c$. Because of the weighting of the collectors, $\frac{1}{7}$ of the current flows through the collectors Q1$a$, Q2$a$ to the A line output terminal 71 or B line output terminal 72, $\frac{1}{7}$ of the current flows through the collectors Q1$b$, Q2$b$ to the emitters of the transistors Q3, Q4, and the remaining $\frac{5}{7}$ of the current flows through the collectors Q1$c$, Q2$c$ to ground. Because the MEAS bar logic signal on the line 65 is high, the transistor Q3 is held off, and the transistor Q4 forces the current into the base of the transistor Q5. The current flowing into the base of the transistor Q5 represents a triggering signal, in that activating the transistor Q5 forces the voltage at the B line output terminal 72 to a little more than a diode drop (Vbe) below CREF, which causes the A/D converter 80 to overflow. Again, the CODEC (not shown) or DSP (not shown) can sense the overflow condition in the A/D converter 80 and set a positive voltage warning flag or take some other action (e.g., change to measure mode).

In the measurement mode, the MEAS logic signal is held high, and the MEAS bar logic signal is held low. In the measurement mode, the currents flowing in the A line output terminal 71 and the B line output terminal 72 are scaled down. Instead of overdriving the A/D converters 75, 80, the voltage monitoring circuit 50 provides outputs from which linear measurements can be made. Because the MEAS bar logic signal on the line 65 is held low, the transistor Q3 is enabled and the current from the collectors Q1$b$, Q2$b$ is diverted to ground.

For measuring negative voltages, the corresponding transistor Q13 for Va and Q14 for Vb turns on. Because the MEAS logic signal line 60 is high, the transistors Q16, Q18 are enabled and current is steered away from the emitter of the transistor Q15. This prevents the transistors Q9, Q10 from pulling current away from the B line output terminal 72. Only the current from the relatively smaller transistors Q11, Q12 remains and flows out of the B line output terminal 72. The transistor Q6 is held off by the MEAS bar logic signal line 65, which places the bases of the transistors Q9 through Q12 at a voltage of approximately ground potential. This provides a ground reference for the negative voltage measurement.

For positive voltages, the transistor Q3 pulls current away from the emitter of the transistor Q4, because the MEAS bar logic signal line 65 is low. The current source 100 holds the transistor Q5 off when the transistor Q4 is also off, thus allowing proportional current to flow from the $\frac{1}{7}$collectors Q1$a$, Q2$a$ to the A line output terminal 71 and B line output terminal 72.

In the measurement mode, voltages proportional to Va and Vb are created at the A line output terminal 71 (Vaf) and B line output terminal 72 (Vbf). The foreign voltage sensor 35 allows foreign voltages to be detected and measured without the need for manual measurement or external test equipment.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A sensor capable of being coupled to a transmission line and monitoring a foreign voltage on the transmission line, comprising a voltage monitoring circuit adapted to operate in a foreign voltage detection mode in response to receiving a first logic signal and a foreign voltage measurement mode in response to receiving a second logic signal, wherein the voltage monitoring circuit is capable of being coupled to an analog to digital converter, and the voltage monitoring circuit is adapted to overdrive the analog to digital converter in response to detecting the foreign voltage in the foreign voltage detection mode.

2. The sensor of claim 1, wherein the voltage monitoring circuit is further adapted to receive a reference voltage input and a battery voltage input, and detect a positive foreign voltage greater than the reference voltage input and a negative foreign voltage more negative than the battery voltage input.

3. The sensor of claim 1, wherein the voltage monitoring circuit includes:
   at least one input terminal capable of being coupled to the transmission line;
   at least one output terminal;
   a positive voltage circuit coupled to the input terminal and the output terminal; and
   a negative voltage circuit coupled to the input terminal and the output terminal.

4. The sensor of claim 3, wherein the positive voltage circuit includes a first transistor coupled to the input terminal and adapted to provide an output current proportional to a positive voltage at the input terminal.

5. The sensor of claim 4, wherein the positive voltage circuit includes a triggering circuit, and the positive voltage circuit is adapted to provide a first portion of the output current to the output terminal and provide a second portion of the output current to the triggering circuit.

6. The sensor of claim 5, wherein the positive voltage circuit is adapted to route a third portion of the output current to ground.

7. The sensor of claim 4, wherein the first transistor comprises a split collector transistor having a plurality of collectors.

8. The sensor of claim 5, wherein the collectors of the first transistor comprise weighted collectors.

9. The sensor of claim 5, wherein the triggering circuit includes:
   a second transistor adapted to receive the second portion and a reference voltage signal and;
   a third transistor coupled to a first voltage source and the output terminal, wherein the second transistor is adapted to enable the third transistor in response to the second portion exceeding a predetermined threshold, and the third transistor is adapted to increase the voltage at the output terminal in response to being enabled by the second transistor.

10. The sensor of claim 5, wherein the triggering circuit includes a second transistor adapted to receive the second portion and route the third portion to ground in response to the logic signal being at the second logic level.

11. The sensor of claim 3, wherein the negative voltage circuit is coupled to a battery voltage input, and the negative voltage circuit includes:
   a diode coupled to the input terminal;
   a first transistor having a first size and being coupled between the diode and the output terminal; and
   a second transistor having a second size and being coupled between the diode and the output terminal, wherein the bases of the first and second transistors are coupled to the battery voltage input.

12. The sensor of claim 11, wherein the diode comprises a third transistor, the base of the third transistor being coupled to the collector of the third transistor.

13. The sensor of claim 11, wherein a current passes through the diode in response to the voltage at the input terminal being more negative than the battery voltage input, the first size is greater than the second size, a first portion of the current passes through the first transistor, a second portion of the current passes through the second transistor, and the magnitude of the first portion relative to the magnitude of the second portion depends on the first and second sizes.

14. The sensor of claim 13, wherein the negative voltage circuit includes a third transistor coupled between the battery voltage input and the bases of the first and second transistors, the base of the third transistor is connected to the logic signal, and the third transistor couples the bases of the first and second transistors from the battery voltage input in response to the logic signal being at the first logic level.

15. The sensor of claim 13, wherein the negative voltage circuit includes a third transistor coupled to the first and second transistors, wherein the base of the third transistor is coupled to the logic signal, and the third transistor reduces the magnitude of the second portion in response to the logic signal being at the second logic level.

16. The sensor of claim 1, wherein the transmission line includes a plurality of conductors, and the voltage monitoring circuit includes a plurality of input terminals capable of being coupled to the conductors, wherein the voltage monitoring circuit is adapted to detect the foreign voltage on at least one of the conductors.

17. A foreign voltage monitoring circuit, comprising:
   at least one input terminal;
   at least one output terminal;
   a positive voltage circuit coupled to the input terminal and the output terminal, the positive voltage circuit including:
      a first transistor having first, second, and third collectors, the first collector being coupled to the output terminal and the third collector being coupled to ground;
      a second transistor coupled to the second collector, the base of the second transistor being coupled to a reference voltage source;
      a third transistor coupled to a first voltage source and the output terminal, the base of the third transistor being coupled to the second transistor; and
      a fourth transistor coupled to the second collector and ground, the base of the fourth transistor being coupled to a measurement mode logic signal;
   a battery voltage input; and
   a negative voltage circuit coupled to the input terminal, the output terminal, and the battery voltage input and adapted to receive a battery voltage input, the negative voltage circuit including:
      a fifth transistor coupled to the battery voltage input, the base of the fifth transistor being coupled to the measurement mode logic signal;
      a diode coupled to the input terminal;
      a sixth transistor having a first size and being coupled to the diode and the output terminal, the base of the sixth transistor being coupled to the fifth diode;
      a seventh transistor having a second size greater than the first size and being coupled to the diode, the base of the seventh transistor being coupled to the fifth diode;
      an eighth transistor coupled to the seventh transistor and the output terminal, the base of the eighth transistor being coupled to a bias voltage source; and
      a ninth transistor coupled to the seventh transistor and the first voltage source, the base of the ninth transistor being coupled the measurement mode logic signal.

18. The circuit of claim 17, wherein the negative voltage circuit further includes:
   a fixed voltage drop element coupled to the battery voltage input;
   a tenth transistor coupled to the bases of the sixth and seventh transistors and ground, the base of the tenth transistor being coupled to the fixed voltage drop element; and a current source connected to the base of the tenth transistor.

19. A method for operating a circuit to detect and measure a foreign voltage on a transmission line, comprising:

providing a first logic signal to configure the circuit to detect the foreign voltage;

detecting the foreign voltage on the transmission line in the circuit;

overdriving an analog to digital converter coupled to the circuit in response to detecting the foreign voltage;

providing a second logic signal to configure the circuit to measure the foreign voltage; and measuring the foreign voltage.

20. The method of claim 19, wherein detecting the foreign voltage includes:

generating a first current proportional to the foreign voltage;

providing at least a first portion of the first current to a triggering circuit; and generating a triggering signal in response to the first portion exceeding a predetermined threshold, wherein overdriving the analog to digital converter comprises overdriving the analog to digital converter in response to the triggering signal.

21. The method of claim 20, wherein the predetermined threshold is a positive threshold for a positive foreign voltage, and the method further includes increasing the voltage at an output terminal of the circuit in response to the triggering signal positive foreign voltage.

22. The method of claim 20, wherein the predetermined threshold is a negative threshold for a negative foreign voltage, and the method further includes decreasing the voltage at an output terminal of the circuit in response to the triggering signal.

23. The method of claim 19, wherein measuring the foreign voltage includes:

generating a first current proportional to the foreign voltage; and providing at least a first portion of the first current to an output terminal of the voltage monitoring circuit.

24. The method of claim 23, wherein measuring the foreign voltage further includes routing a second portion of the first current to ground.

25. A foreign voltage monitoring sensor capable of being coupled to a transmission line; comprising:

means for detecting a foreign voltage on the transmission line;

means for overdriving an analog to digital converter coupled to the circuit in response to detecting the foreign voltage;

means for generating a foreign voltage detection signal; and means for measuring the foreign voltage in response to the foreign voltage detection signal.

* * * * *

UNITED STATES PATENT AND TRADEMARK OFFICE
CERTIFICATE OF CORRECTION

PATENT NO. : 6,356,624 B1
DATED : March 12, 2002
INVENTOR(S) : Apfel et al.

It is certified that error appears in the above-identified patent and that said Letters Patent is hereby corrected as shown below:

<u>Title page,</u>
Item [73], delete "Assignee: Leserity, Inc., Austin, TX (US)" and insert
-- Assignee: Legerity, Inc., Austin, TX (US) --

Signed and Sealed this

Sixteenth Day of September, 2003

JAMES E. ROGAN
*Director of the United States Patent and Trademark Office*